United States Patent [19]

El-Kareh et al.

[11] Patent Number: 5,602,489
[45] Date of Patent: Feb. 11, 1997

[54] SWITCH POTENTIAL ELECTRON BEAM SUBSTRATE TESTER

[75] Inventors: Auguste B. El-Kareh, Los Altos; Qing-Tang Jiang; MingYang Li, both of Sunnyvale, all of Calif.

[73] Assignee: Alcedo, Sunnyvale, Calif.

[21] Appl. No.: 349,508

[22] Filed: Dec. 2, 1994

[51] Int. Cl.$^6$ .................................................. G01R 31/02
[52] U.S. Cl. ........................ 324/75.1; 324/73.1; 324/501; 324/71.3; 250/310
[58] Field of Search ................................... 324/751, 501, 324/73.1, 71.3; 250/310, 71.4, 311

[56] References Cited

U.S. PATENT DOCUMENTS

| | | | |
|---|---|---|---|
| 4,277,679 | 7/1981 | Feuerbaum | 324/751 |
| 4,829,243 | 5/1989 | Woodard, Sr. et al. | 324/751 |
| 4,943,769 | 7/1990 | Golladay et al. | 324/751 |
| 5,017,863 | 5/1991 | Mellitz | 324/751 |
| 5,057,773 | 10/1991 | Golladay et al. | 324/751 |
| 5,097,204 | 3/1992 | Yoshizawa et al. | 324/751 |

*Primary Examiner*—Kenneth A. Wieder
*Assistant Examiner*—Barry C. Bowser
*Attorney, Agent, or Firm*—Blakely, Sokoloff, Taylor & Zafman

[57] ABSTRACT

The present invention describes a method for testing the interconnect networks of a multichip module for opens and shorts. An electron beam lands on a pad of an interconnect network located on a substrate. The electron beam is used to interrogate the pad. An extract grid located above the substrate is maintained at a positive potential. While the electron beam interrogates the pad, the pad emits secondary electrons until such a point that the pad reaches a positive potential near that of the positive potential of the extract grid. The extract grid is then switched to a negative potential. The pad, still being interrogated by the electron beam, then collects secondary electrons until such a point that the pad reaches a negative potential near that of the negative potential of the extract grid. The test time, the length of time it takes for the pad to change from the positive potential to the negative potential, is measured and compared to a reference value. From this comparison it can be determined whether the interconnect network is defect-free, open, or shorted. If the test time is approximately equal to the reference value then the interconnect network is defect-free. If the test time is lower than the reference value then the interconnect network contains an open. If the test time is higher than the reference value then the interconnect network is shorted to another interconnect network or etc. Additionally, the above described invention can be accomplished by maintaining the extract grid at ground potential and switching the potential of a backplate.

21 Claims, 12 Drawing Sheets

SWITCH POTENTIAL ELECTRON BEAM SUBSTRATE TESTER

BACKGROUND Of THE INVENTION

1. Field of the Invention

This invention relates to the field of testing the electrical integrity of electrical pathways on a substrate, and more specifically, to a contactless method and apparatus for testing the interconnect networks of, for example, multichip modules, flat panel displays, printed circuit boards, and other substrates for opens and shorts.

2. Background Information

In the manufacture of semiconductor devices, such as multichip modules (MCMs), flat panel displays, printed circuit boards (PCBs), and other substrates, advances in integrated circuit technology are resulting in increased chip packing densities which require finer linewidths and an increased number of substrate interconnection networks. Complex substrates contain thousands of interconnect wiring networks with more than ten thousand chip interconnect bonding pads (pads) to interconnect the integrated circuit chips. As the number of interconnect networks (networks) increase on a substrate, so do the number of defects. Therefore, testing and inspection of these networks for opens and shorts becomes increasingly more important.

Testing and inspection of interconnect networks are important requirements that reduce the cost and increase the reliability of substrates. Existing methods and apparati for testing the substrate have made it economically advantageous to test the substrates before bonding expensive chips to them. Such methods and apparati ultimately increase the final test yield and reduce expensive rework. Examples of such methods and apparati are the Mechanical Probe and Voltage Contrast Systems.

The Mechanical Probe System

Mechanical Probe systems are generally categorized into two types: the single probe system and the dual probe system. Both systems work by contacting the probes to a pad on an interconnect network. The single probe system measures the capacitance of an interconnect line. The measured value of capacitance is then compared to a reference or known capacitance value. If the measured value equals the known value then the pads are properly interconnected. If the measured value is greater than the known value then a short is detected. If the measured value is less than the known value then an open is detected.

The dual probe system works by taking two probes, placing them on separate pads, and measuring the resistance between those pads. The measured value of resistance is then compared to a reference or known resistance value. If the measured value equals the known value then the pads are properly interconnected. If the measured value is different than the known value then either an open or a short is detected.

Mechanical probe systems are effective but inefficient. The mechanical motion required to move and place a probe on a pad is slow and decreases the throughput of the testing system. Mechanical probes also have other disadvantages. Due to the actual physical contact between the probe and pad in a mechanical probe system, the probe may damage the pad or leave particulate contamination on the pad surface. Pad damage and contamination ultimately decrease the test yield and have a significant impact on device performance. Another disadvantage of mechanical probes is that they are not applicable to features below 25 microns. As semiconductor device feature sizes become smaller and smaller, mechanical probes become more and more obsolete.

Electron Beam Substrate Testers (EBST).

In response to the problems encountered with the mechanical probe system, contactless systems for testing substrates, also known as electron beam substrate testers (EBST), have been developed. Electron beam substrate testers use a focused beam of electrons (e-beam) to interrogate the pads of the interconnect networks. EBST systems function in substantially the same manner as the single probe mechanical system. The e-beam is used to apply a charge to a network pad (charged pad) and to measure the presence or absence of charge on other pads, thereby testing for network open circuits and network to network shorts, as will be described in more detail below.

There are several advantages of EBST systems over mechanical probe systems. The electron beam is an essentially non-contact probe which does not damage the pads and circuitry of the device under test (DUT), thus increasing the final test yield of DUTs. Also, the e-beam can be vectored from pad to pad in microseconds while a conventional mechanical probe requires milliseconds per move. The speed advantage of the e-beam is compounded by a further reduction in the number of test vectors. In order to achieve 100% fault detection using an EBST system on a substrate with N pads, f(N) test vectors are required. By comparison, the dual probe mechanical systems described above require $f(N^2)$ test vectors. Single probe mechanical systems, like EBST, require f(N) test vectors but are 1000 times slower than EBST and have limited probing resolution. For example, a complex substrate can be tested, using an EBST system, in less than two minutes including handling time. A further advantage of EBST systems is that the e-beam can be focused to a finer resolution such that the e-beam is defined to be smaller in diameter than the pad being charged or interrogated. Thus, EBST systems are applicable to features well below 25 microns.

EBST systems operate using the secondary emission yield. The secondary emission yield ($\delta$) is the ratio of the number of secondary electrons emitted from the pad (secondary electrons, m) to the number of primary electrons landing on the pad (primary electrons, n), $\delta = m/n$. FIG. 1 illustrates the secondary emission yield plotted as a function of the energy of the primary e-beam landing on the pad. Although the value of $\delta$ varies from material to material the general shape of the graph is the same. Initially, the value of $\delta$ is below 1, since the energy of the primary e-beam is insufficient to dislodge a large number of secondary electrons. As the energy of the primary e-beam increases, the value of $\delta$ increases. However, as the energy of the primary e-beam increases further, the primary electrons penetrate deeper into the pad and although more secondary electrons are dislodged fewer reach the surface of the pad, so that the value of $\delta$ starts to decrease.

In one example of an EBST system, a substrate, which contains a complex network of interconnect lines and pads, is floating with respect to ground. In other words, the substrate is insulated while being bombarded by the e-beam. Located in the vicinity of the substrate is a collector which is held sufficiently positive to attract electrons. In general, this collector is referred to as an extract grid located above the substrate and is held at approximately +10 volts. When a primary e-beam lands on a pad of the substrate with an energy, such that $\delta < 1$, the pad will acquire more electrons than it loses and will eventually be negatively charged. When the e-beam lands with an energy, such that $\delta > 1$, the secondary electrons emitted by the pad are collected by the extract grid and the pad will eventually be positively charged. When δ=1, the pad acquires no net charge.

An EBST system uses the secondary emission spectrum detected at a network pad to determine if there is a charge on that pad. FIG. 2 illustrates a secondary electron spectrum of a preferred embodiment of the present invention. As an example, the secondary electron spectrum in FIG. 2 demonstrates the difference in intensity of the secondary emitted electrons coming from a charged and uncharged pad. FIG. 2 illustrates, as an example, that when a pad is uncharged its secondary electron spectrum has a peak centered near 5 eV. When a pad is charged the secondary electron peak shifts over by an amount approximately proportional to the amount of charge on the pad.

The Voltage Contrast System

The voltage contrast system essentially measures the presence or absence of charge on an interconnect line in an analogous fashion to that of the mechanical probe testing system. FIG. 3 illustrates how a typical voltage contrast system works on a substrate 300 that contains several interconnect networks. Interconnect networks (networks) are a series of wiring networks with bonding pads (pads) that connect the circuitry of VLSI chips. Illustrated in FIG. 3 are three networks, a first network containing network pads 310 and 311 (pads), a second network containing pad 312, and a third network containing pad 313. An electron beam 350 (e-beam) is positioned on a pad 310. First, the voltage of pad 310 is measured for a precharged condition. Voltages are measured by a secondary electron energy analyzer (FIG. 4) to detect corresponding changes in the secondary electron distribution. The type of change in the secondary electron distribution will tell whether the pad is charged or uncharged (as is described in the discussion of FIG. 2 above). If a charge is present on pad 310 then a short to a previously charged network is assumed since the network containing pad 310 has not previously been interrogated and, therefore, no charge should be present on pad 310. If there is no preexisting charge, the second step of the system is to charge pad 310 to a predetermined voltage using e-beam 350. The third step is to determine the continuity of the network containing pad 310. This is accomplished by probing the remaining pads (311, 312, and 313) on substrate 300 for the predetermined voltage. For example, since pad 311 is on the same network as pad 310, then a charge should be found on pad 311. If a charge is found on pad 311 then pad 310 and pad 311 are properly connected. If no charge is present on pad 311 then an open in the network is found. Since pads 312 and 313 are not contained in the same network as pads 310 and 311 no charge should be present on pads 312 and 313. If a charge is found on pads 312 and 313 then a short to a previously tested network is assumed since neither network containing pads 312 and 313 have been previously tested. These three steps are repeated for each network on the substrate.

Before testing the substrate and between major test sequences involving numerous networks, electrostatic charges must be removed from the substrate being tested in order to avoid testing errors. Since it is impossible to interrogate a pad without depositing some amount of charge on a pad the amount of electrostatic charge that is built up on a substrate during a test sequence can be very substantial. This build up of electrostatic charge on the substrate can make testing the substrate more difficult and cause testing errors. Thus, to avoid these problems, an electron flood gun (flood gun) is used to remove the electrostatic charges on a substrate. The flood gun floods the entire substrate with electrons effectively erasing any charge disparity between the networks on the substrate.

FIG. 4 illustrates a secondary electron analyzer as used in a voltage contrast system. The substrate 400 is located on x-y stage 440 (stage) and is floating with respect to ground. E-beam 450 electronically interrogates substrate 400 one section at a time. Substrate 400, for example, can be divided into several one inch by one inch sections. If substrate 400 is larger than the section e-beam 450 is able to interrogate, then stage 440 must mechanically move substrate 400 such that every network on substrate 400 may be interrogated. Extract grid 410 (grid) is held at approximately +10 volts and acts as a collector. Detector 420 is generally a photo-multiplier tube (PMT) and detects the changes in the secondary electron distribution of a network pad. Electron flood gun 430 (flood gun) floods the entire substrate with electrons as described above.

The voltage contrast system while an improvement over the mechanical probe system, in that it is a contactless system, still has several disadvantages. Although the e-beam may be vectored 1000 times faster than mechanical probes, the voltage contrast system is still relatively slow for large substrates. In the voltage contrast system, once a charge is placed on a pad the e-beam must interrogate every other pad on the substrate to test for the presence or absence of that charge. In complex substrates the number of pads is substantial and every pad must be tested. This means that for relatively large substrates, for example an 8 inch by 8 inch substrate, the x-y stage must zig and zag back and forth so that every pad on the substrate can be interrogated.

Another problem which decreases throughput of the voltage contrast system is the need to remove electrostatic charges from the substrate in order to avoid testing errors. Flood guns cause substantial noise at the PMT and the testing must wait for several milliseconds after flood to be sure the electron cloud has dissipated before testing can resume. Since this procedure must be repeated thousands of times during the testing of complex substrates, the testing time is substantially prolonged.

An additional disadvantage particularly sesitive with the voltage contrast system is that testing errors can result from beam spillover. Beam spillover occurs when two or more networks are adjacent to each other, for example 100 microns apart, and electrons from the e-beam interrogating one pad spill over to a pad on an adjacent network. Beam spillover, in this instance, gives erroneous results when the voltage on the pad of the adjacent network is later interrogated. Such beam spillover would lead the tester to erroneously conclude that the pad on the adjacent network is shorted to a previously tested network.

With electron beam testing one must ascertain proper registration. Improper registration occurs when the e-beam does not land directly on the pad and can occur if the e-beam has a low resolution or is improperly vectored. If improper registration occurs the e-beam deposits a charge on the insulator. If a relatively high voltage is used, for example 10 keV, as is commonly used with the voltage contrast method, the insulator will hold this charge indefinitely with very little leakage. The charged insulator causes a distortion of the field and the tester can no longer function with high reliability.

There are several ways to avoid the deleterious effects of improper registration. The first, and most obvious, is to vector the e-beam to the exact location of the pad. This requires registration of the substrate with known fiducial marks. Fiducial marks are marks on the substrate that allow the substrate to be aligned with the testing system such that the e-beam may be vectored to the registered interconnect networks and pads using an x-y coordinate system. The placement of fiducial marks on the substrate requires additional processing steps and equipment. The additional processing steps and equipment require substrate manufacturers to make costly changes in their process which most manufacturers are reluctant to do.

A second way to avoid the deleterious effects of improper registration is to use two different voltages to accelerate the electron beam. The first beam would be used to find the exact location of the pad being interrogated. The first beam would have a low voltage, approximately 600 to 1000 volts, such that no deleterious effects would be caused if the beam landed on the insulator. Once the exact location of the pad is found with the first beam, the second beam, which has a higher voltage, generally 10 keV, can then be vectored to that exact location. This allows interrogation of the pad without the effects of improper registration. However, using two beams is very costly.

Another method to avoid the deleterious effects of improper registration and still obtain the necessary beam resolution is to accelerate the beam at approximately 5 to 10 keV and then decelerate the beam to approximately 600 to 1000 volts just before it lands on the pad. This method requires some special equipment to be incorporated in the tester but does not significantly decrease the throughput of the tester. However, the deceleration of the electron beam tends to deteriorate the quality of the spot size and limits the area which can be addressed electronically.

Thus, what is needed is a method and apparatus to test and inspect the interconnect networks of MCMs, PCBs, flat panel displays, and other substrates for opens and shorts that will increase the test yield and increase the throughput of the system as technology advances and the density of interconnect networks on substrates increase.

SUMMARY OF THE INVENTION

The present invention describes a method and apparatus for testing the interconnect networks of a multichip module for opens and shorts. In the present invention, an electron beam is used to interrogate a pad on an interconnect network. During the interrogation of the pad with an electron beam an extract grid is switched from a positive potential to a negative potential causing a change in the secondary electron emissions of the pad. As the secondary electron emissions of the pad changes, the potential on the pad changes from a first potential to a second potential. The length of time it takes for the pad to change from the first potential to the second potential is measured and compared to a reference value. From this comparison it can be determined whether the interconnect network is defect-free, open, or shorted.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which.

DETAILED DESCRIPTION

A Switch Potential Electron Beam Substrate Tester is disclosed. In the following description, numerous specific details are set forth such as specific materials, equipment, process parameters, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention is a method for testing the electrical integrity of electrical pathways on a substrate. For example, the present invention can be used to test the electrical integrity of interconnect networks on printed circuit boards (PCBs), complex multichip modules (MCMs), flat panel displays, and other substrates. The present invention, the switch potential system, is a contactless method for testing substrates, such as MCMs, and incorporates the use of an electron beam and its corresponding secondary electron emission yield to determine if the interconnect network is properly connected (defect-free), shorted, or open.

The Switch Grid Method

Figure 5A:
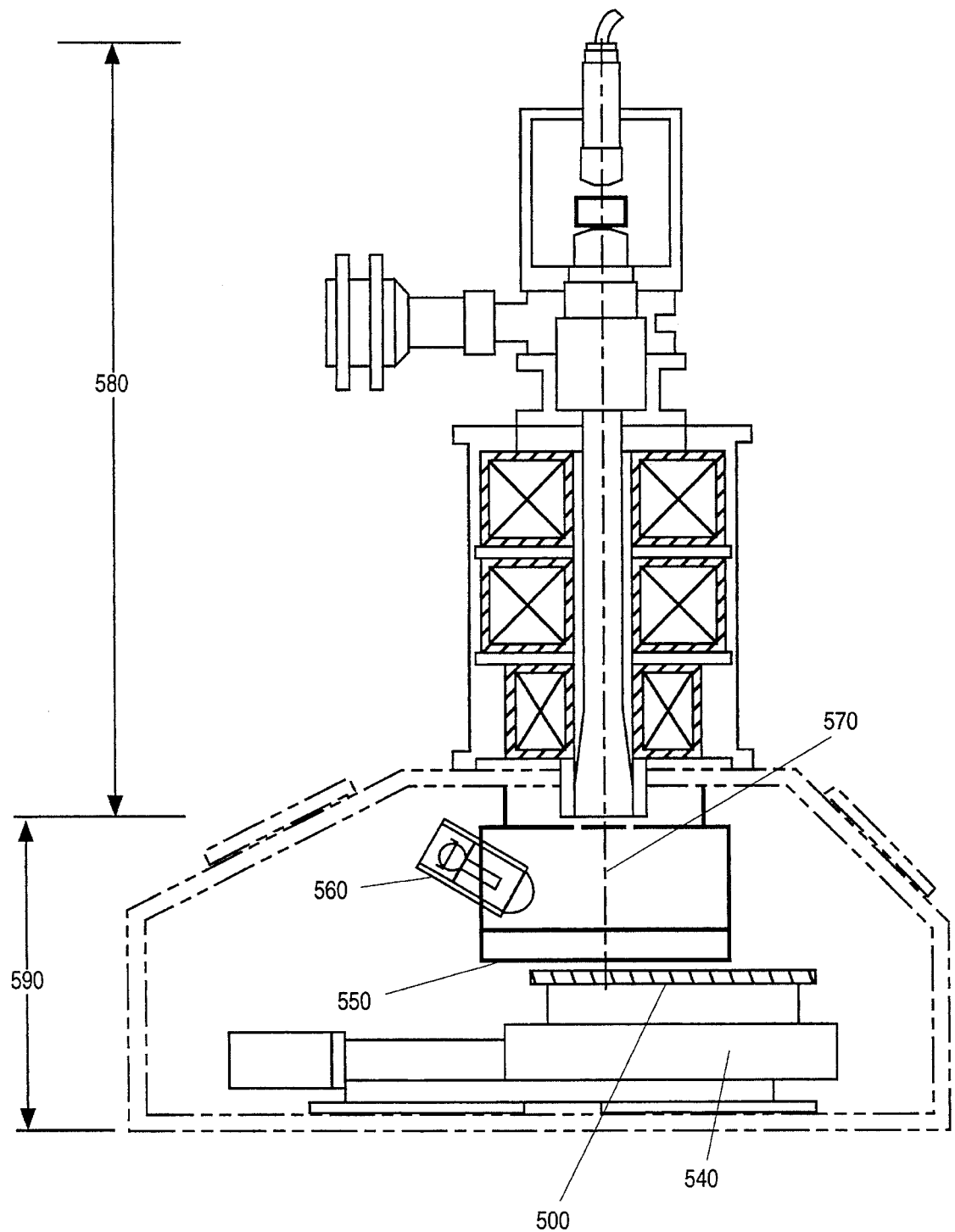
FIG. 5a is a cross sectional diagram of the switch grid system apparatus used in a preferred embodiment of the present invention.

FIG. 5a illustrates the switch potential system apparatus of a preferred embodiment of the present invention, the switch grid method. The apparatus of FIG. 5a consists of two main parts: the electron beam column 580 and the secondary electron analyzer 590. Electron beam column 580 is a complex apparatus comprising an electron source, blanking plates, alignment coils, condenser lenses, focus lenses, and deflection coils. Electron beam column 580 is designed to control and focus the electron beam 570 during substrate testing. In secondary electron analyzer 590, the substrate to be tested, substrate 500, is placed on x-y stage 540 and is floating with respect to ground. E-beam 570 is used to interrogate the interconnect pads (pads) on substrate 500.

Figure 5B:
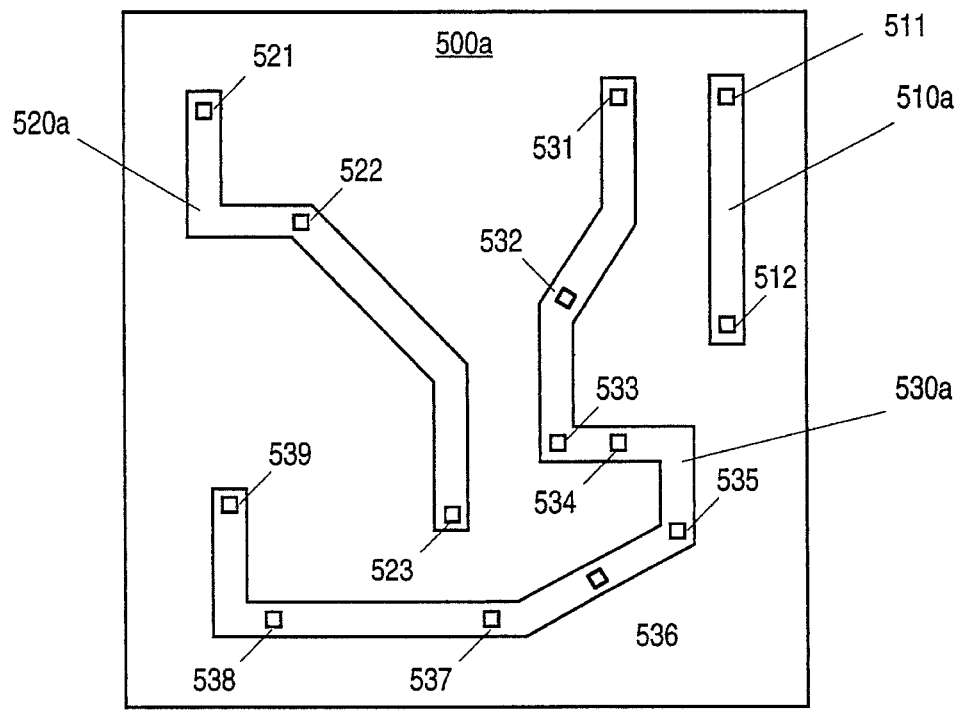
FIG. 5b illustrates a portion of a substrate having several defect-free interconnect structures.

FIG. 5b illustrates a portion of a substrate 500a with small interconnect network (small network) 510a, medium interconnect network (medium network) 520a, and large interconnect network (large network) 530a. Small network 510a has two interconnect pads (pads) 511 and 512. Medium network 520a has three interconnect pads (pads) 521,522, and 523. Large network 530a has ten interconnect pads (pads) 531 through 539. It should be noted that the small, medium, and large networks illustrated in FIG. 5b are only examples and networks no matter what the size may contain only a few pads or thousands of pads.

In a currently preferred embodiment the testing area is divided into one inch by one inch sections such that e-beam 570 only interrogates a one inch by one inch section at a time. The section to be tested is aligned with e-beam 570 by moving x-y stage 540 along a horizontal x-y coordinate system. E-beam 570 is vectored to land on a pad and interrogate the pad with an energy of a few hundred to a few thousand volts. In a currently preferred embodiment the energy of the e-beam is approximately 600–1000 eV (0.6–1.0 keV). The pad to be interrogated is constantly emitting and absorbing electrons, and is said to be in a state of equilibrium, with respect to itself, because the pad is simultaneously emitting the same amount of electrons as it is absorbing. Thus, the pad is at a constant potential. Because e-beam 570 is landing at an energy of approximately 0.6–1.0 keV the equilibrium of the pad will be upset. When the pad is interrogated with e-beam 570, the pad will either have a net absorbtion of electrons, thus becoming more negatively charged; have a net emission of electrons, thus becoming more positively charged; or will simultaneously emit approximately the same amount of electrons as it absorbs, thus remaining at a constant potential (i.e. remain in a state of equilibrium).

During the interrogation of a pad, extract grid 550, located above the substrate, is maintained at a positive potential. In a currently preferred embodiment extract grid 550 is maintained at a positive potential of approximately +10 volts. Since e-beam 570 is interrogating the pad with an energy of a few hundred to a few thousand volts the secondary emission yield is greater than one ($\delta>1$). Thus, e-beam 570 upsets the equilibrium of the pad. As e-beam 570 lands on a pad, the potential on the pad will change depending upon the potential of extract grid 550. When e-beam 570 lands on the pad the pad emits secondary electrons. Since extract grid 550 is at a positive potential the extract grid will attract (or collect) the secondary electrons emitted by the pad which causes the pad to have a net loss of negative charge. Thus, as the secondary electrons leave, the pad will become positively charged. Eventually the pad becomes slightly more positive than extract grid 550. At this point the secondary electrons now come back to the pad rather than being collected by extract grid 550. Now, eventually the pad will absorb enough secondary electrons (i.e. have a net gain of negative charge) that it becomes slightly more negative (or slightly less positive) than extract grid 550. Because extract grid 550 is slightly more positive it will again begin to collect the secondary electrons emitted by the pad causing the pad to have a net loss of negative electrons and once again the pad becomes slightly more positive. It is at this point that the pad and the extract grid are said to have reached a first state of equilibrium with respect to one another (i.e. the point where the pad becomes slightly more positive than the extract grid and has a net absorbtion of electrons, until eventually the pad becomes slightly more negative than the extract grid and has a net emmission of electrons, until the pad once again becomes slightly more positive than the extract grid, etc. and the whole process repeats). In a currently preferred embodiment this first state of equilibrium (or near equilibrium) is reached when the pad reaches a positive potential of approximately +12 volts. For the purposes of the disclosure of the present invention, the process used to reach this first state of equilibrium is referred to as "defining the potential" on a pad.

Once this first state of equilibrium is reached (i.e. once the potential on the pad is defined) and while e-beam 570 is landing on the pad, extract grid 550 is switched to a negative potential. In a currently preferred embodiment extract grid 550 is switched to a negative potential of approximately −10 volts. Because e-beam 570 is still landing at an energy of approximately 0.6–1.0 keV and extract grid 550 is now at a negative potential, equilibrium is disrupted and the charge on the pad will change until the pad and extract grid are once again in a state of equilibrium.

When e-beam 570 lands on the pad and extract grid 550 is held at a negative potential, the pad absorbs secondary electrons. Since the pad is at the positive potential of the first equilibrium state, the pad will absorb secondary electrons which causes the pad to have a net gain of negative charge. Thus, as the pad absorbs secondary electrons, the pad will become negatively charged. Eventually the pad becomes slightly more negative than extract grid 550. At this point the secondary electrons are collected by extract grid 550 rather than being absorbed by the pad because the extract grid is slightly more positive than the pad. Now, eventually extract grid 550 will collect enough secondary electrons that it will cause the pad to have a net loss of negative charge. In other words, the pad will be less negative (more positive) than extract grid 550. Because the pad is slightly less negative (more positive than the extract grid) it will again begin to absorb secondary electrons thus, the pad will have a net gain of secondary electrons and once again the pad becomes slightly more negative than extract grid 550. It is at this point that the pad and the extract grid are said to have reached a second state of equilibrium with respect to one another (i.e. the point where the pad becomes slightly more negative than the extract grid and has a net loss (emission) of electrons, until eventually the pad becomes slightly more positive than the extract grid and has a net gain (absorbtion) of electrons, until the pad once again becomes slightly more negative than the extract grid, etc, and the whole process repeats). in a currently preferred embodiment this second state of equilibrium (or near equilibrium) is reached when the pad reaches a negative potential of approximately −8 volts.

The change from the first (positive) equilibrium state to the second (negative) equilibrium state is referred to as "charging-up" of the pad. It will be obvious to one with ordinary skill in the art that the "charging-up" process may also be accomplished by switching extract grid 550 from a negative potential to a positive potential, instead of the positive to negative switch described above. It should also be noted that it will be obvious to one with ordinary skill in the art that extract grid 550 may be switched between other voltages, for example, +5 volts and −5 volts, +1 volt and −1 volt, or even much higher voltages.

The length of time it takes or the speed with which the pad changes from the first equilibrium state to the second equilibrium state depends upon the capacitance of the interconnect network. It should be noted that the capacitance of the interconnect network depends on the materials comprising the interconnect structure, the dielectric, the network size, and other factors. Assuming all the interconnect networks on substrate 500a are made of the same material, small network 510a will take less time to charge-up than medium network 520a and therefore has a lower capacitance.

Figure 5C:
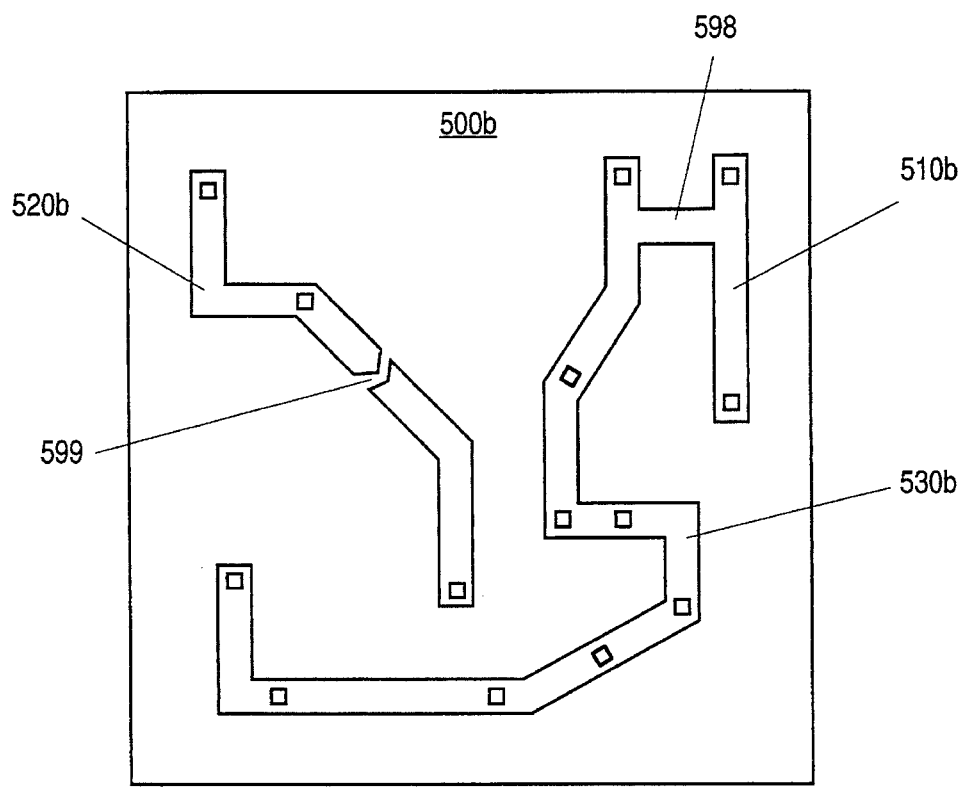
FIG. 5c illustrates a further portion of the substrate in FIG. 5b having interconnect structures containing defects.
Figure 5D:
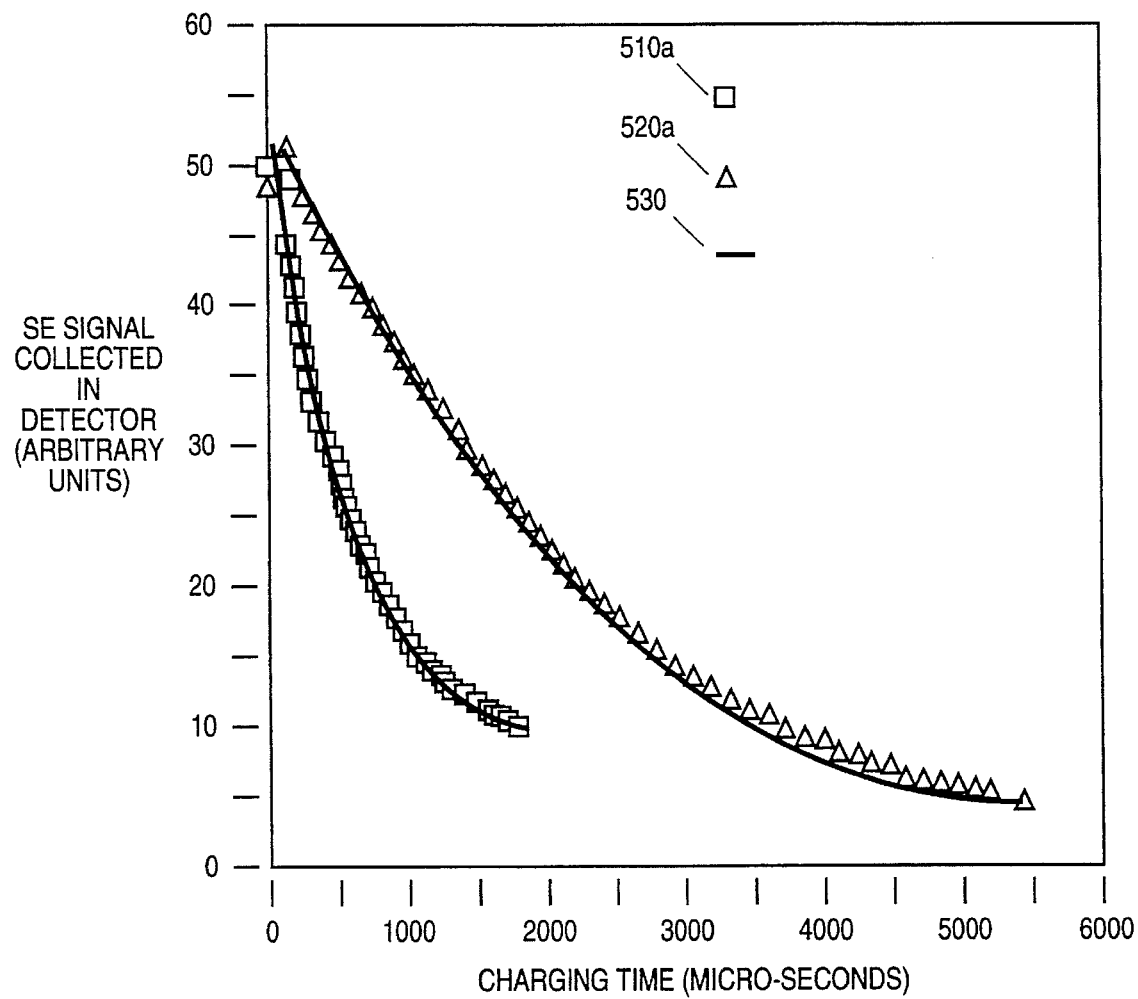
FIG. 5d is a graphical illustration of the charging time of a pad on the defect-free interconnect structures of FIG. 5b.

FIG. 5d is a graphical illustration of the charging time of pad 511 on defect-free small network 510a and pad 521 on defect-free medium network 520a. As each pad changes from the positive equilibrium state to the negative equilibrium state the number of secondary emitted electrons measured by the detector, photomultiplier tube (PMT) 560, decreases until the pad reaches the negative equilibrium state. The decrease in secondary electrons detected by the PMT is due to the net absorbtion of electrons by the pad such that the pad can reach a negatively charged state. As shown in FIG. 5d, the charging time for pad 511 is approximately 1200 μsec and the charging time for pad 521 is approximately 4500 μsec.

The charging time of a pad is a function of the capacitance of the network to which the pad is attached. The capacitance of the network changes based upon whether the network is properly connected (defect-free), open, or shorted. The charging time for each pad being interrogated is measured and compared to a reference value to determine if the network is defect-free, open, or shorted. The reference value generally is provided by the manufacturer of the substrate, however, it will be obvious to one with ordinary skill in the art that a reference value can be generated by testing a known healthy substrate. Another method is to carefully test several substrates and, then, assuming it is not very likely that the same defect will be on each substrate, generate a reference value. As shown in FIG. 5d, the simulation (or reference value) is a good match to the charge-up curves measured using the present invention, thus the nets are defect-free.

FIG. 5c illustrates substrate 500b with small network 510b shorted to large network 530b by connection 598 and medium network 520b with open 599. Connection 598 increases the capacitance of small network 510 and large network 530, thereby increasing the charging time of pads on both the small and large networks. It should be noted that connection 598 causes a dramatic increase in the capacitance of small network 510, while the increase in the capacitance of large network 530 will be very slight. Open 599 decreases the capacitance of medium network 520, thereby decreasing the charging time of pads on the medium network. It should be noted that the measured decrease in capacitance caused by open 599 will vary depending upon the location of the pad being interrogated with respect to the location of open 599. For instance, if the pad being interrogated is at one end of the network and open 599 is located close to that pad the decrease in capacitance will be large. However, if the pad being interrogated is at one end of the network and open 599 is located at the opposite end of the network, then the decrease in the capacitance will be relatively small.

Figure 5E:
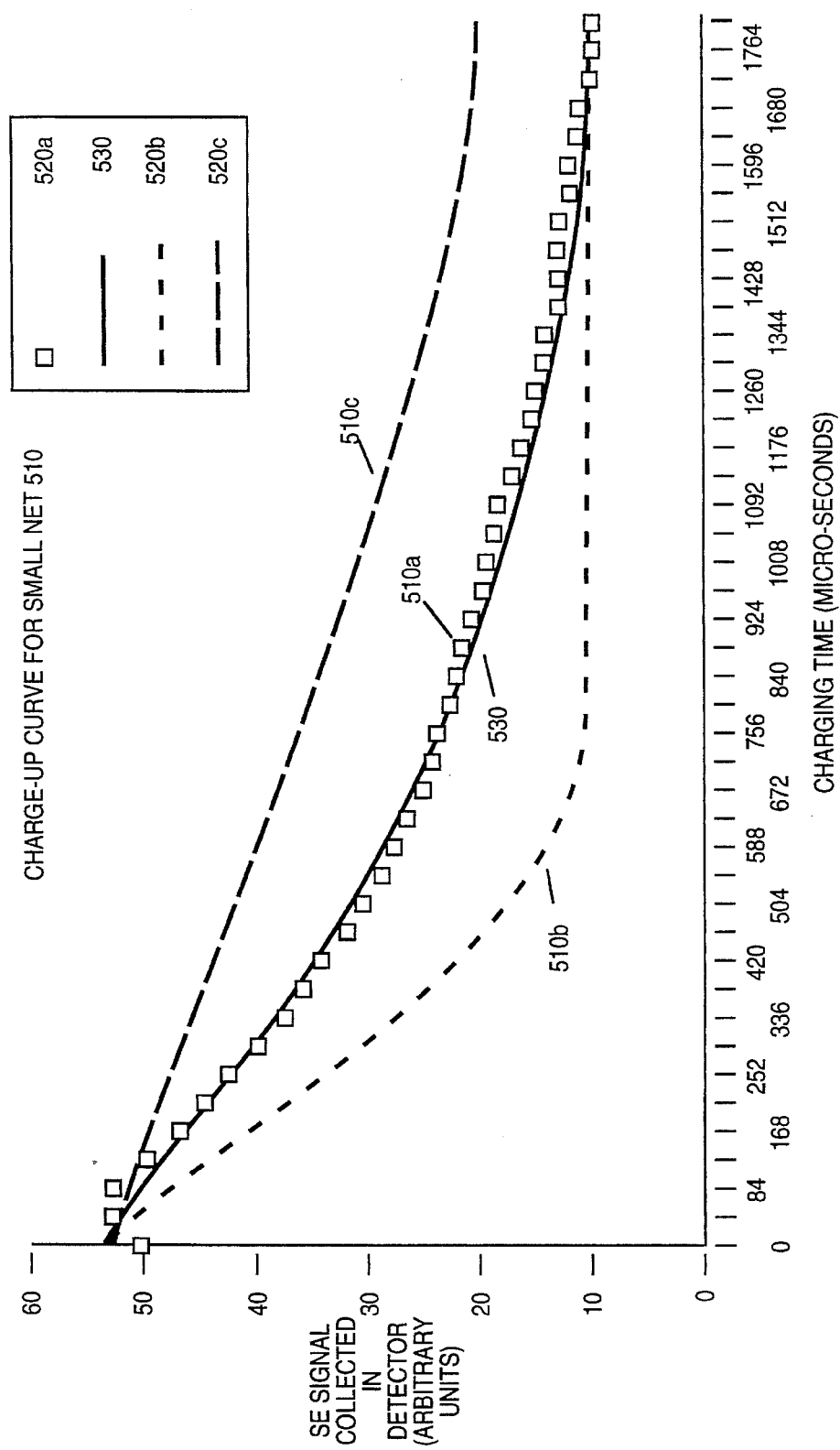
FIG. 5e is a graphical illustration of the differences in charging time of a small interconnect network when the network is open, defect-free, or shorted.

FIG. 5e illustrates the differences in charging time of pad 511 on small network 510 when the network is open, defect-free, or shorted. The charging time for pad 511 on defect-free small network 510 is approximately 1200 μsec. An open network has a decreased capacitance, therefore, a pad on an open network has a lower charging time than a pad on a defect-free network. The charging time for open small network 510 is approximately 650 μsec. A shorted network has an increased capacitance, therefore, a pad on a shorted network has a higher charging time than a pad on a defect-free network. Shorted small network 510 has a longer charging time and by extrapolating the graph in FIG. 5e for shorted small network 510 the charging time can be shown to be approximately 2400 μsec.

Figure 5F:
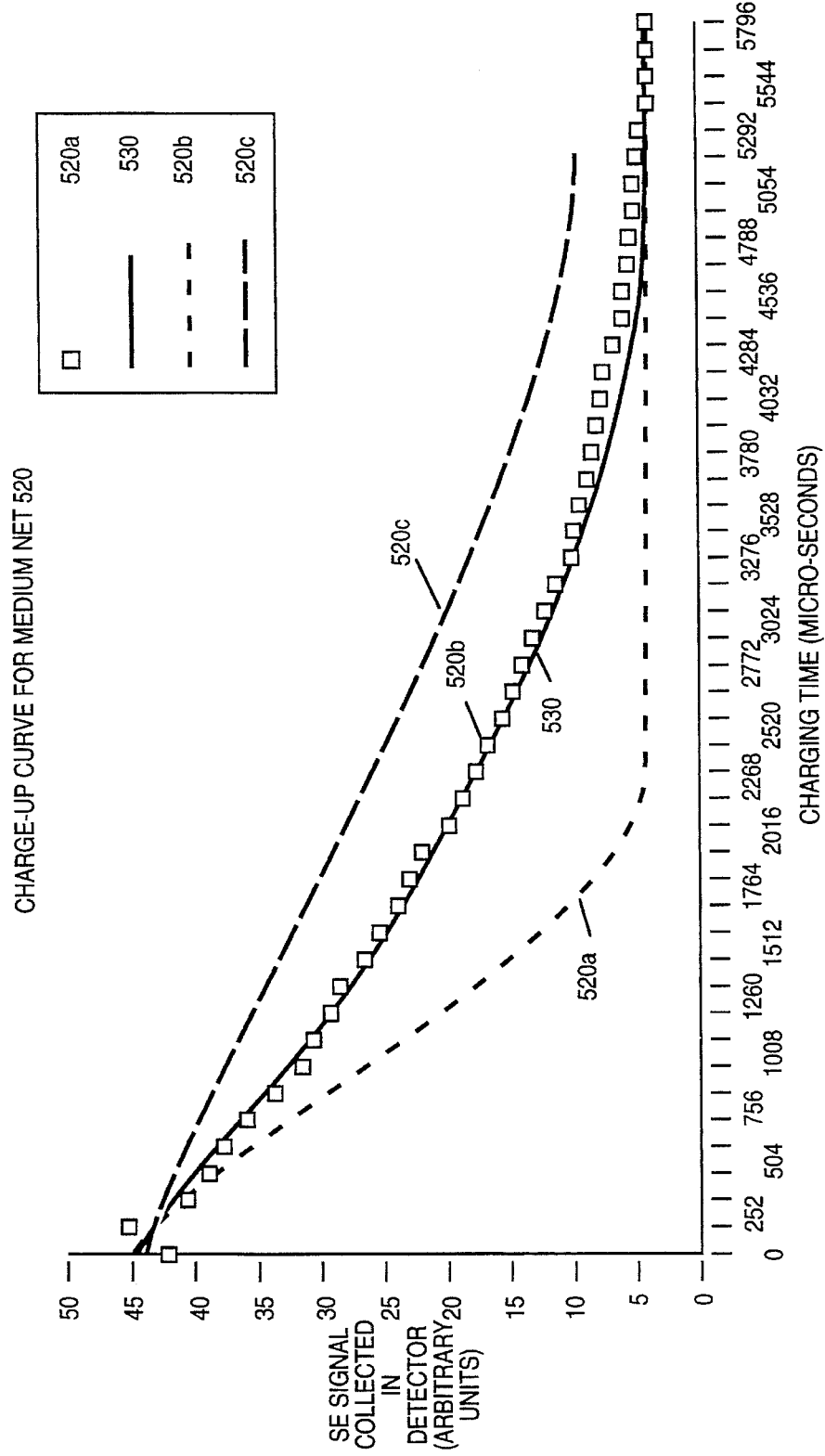
FIG. 5f is a graphical illustration of the differences in charging time of a medium interconnect network when the network is open, defect-free, or shorted.

FIG. 5f (similar to FIG. 5e) illustrates the differences in charging time of pad 521 on medium network 520 when the network is open, defect-free, or shorted. The charging time for pad 521 on defect-free medium network 520 is approximately 4500 μsec. An open network has a decreased capacitance, therefore, a pad on an open network has a lower charging time than a pad on a defect-free network. The charging time for open medium network 520 is approximately 2100 μsec. A shorted network has an increased capacitance, therefore, a pad on a shorted network has a higher charging time than a pad on a defect-free network. Shorted medium network 520 has a longer charging time and by extrapolating the graph in FIG. 5f for shorted medium network 520 the charging time can be shown to be approximately 8900 μsec.

Figure 6:
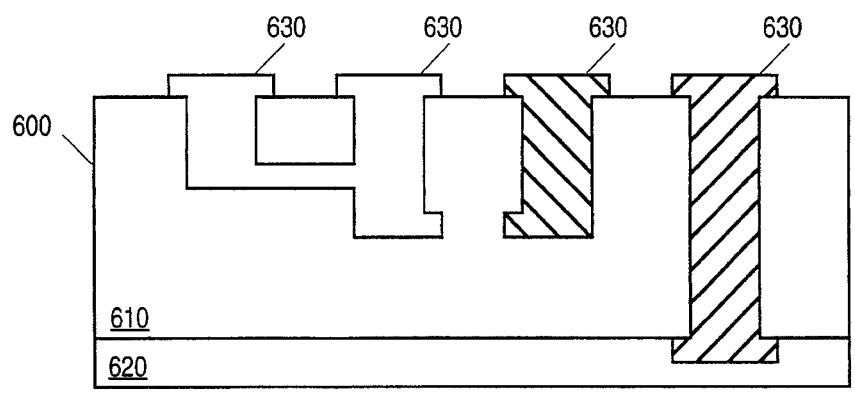
FIG. 6 is a cross sectional diagram of a substrate which contains a backplate.

The method for testing interconnect networks by switching the potential of the extract grid, described above, is advantageous for use with substrates which already contain a backplate. A backplate is a conducting material (e.g. a metal) that can be attached to a substrate and is used for grounding the substrate or for shielding the substrate from noise or etc. below the substrate. FIG. 6 is a cross-sectional view of substrate 600 containing a backplate 620. Backplate 620 acts as a shield between the networks on substrate 610 and any surface underlying backplate 620, for example, x-y stage 540 of the secondary electron analyzer 590 shown in FIG. 5a.

Figure 7:
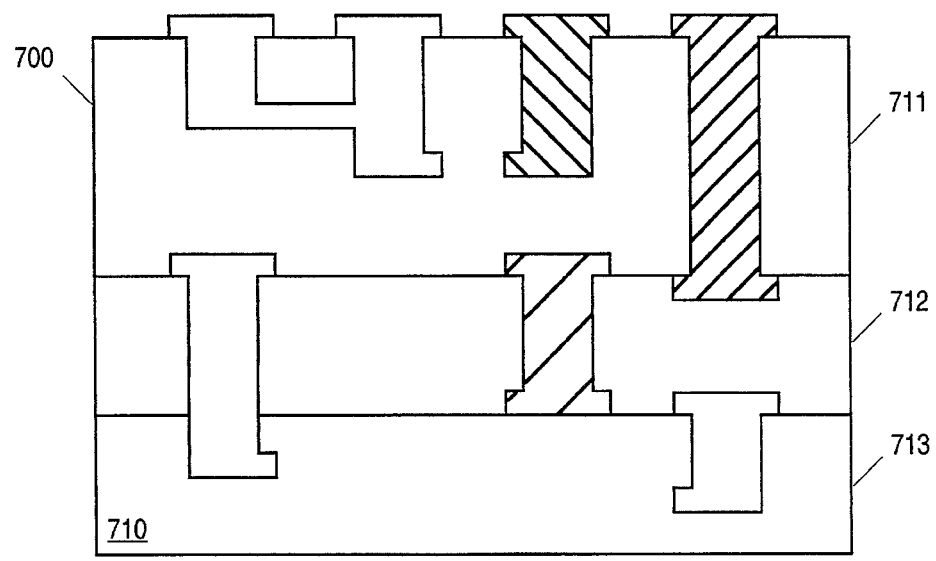
FIG. 7 is a cross sectional diagram of a substrate which contains several levels of interconnect networks.

The above described embodiment for testing interconnect networks by switching the potential of the extract grid is also advantageous for complex substrates with multiple levels of interconnect networks. FIG. 7 is a cross-sectional view of substrate 700 which contains three levels of interconnect networks. When testing the interconnect networks of Level 711, Levels 712 and 713 act as a shield between the networks on Level 711 and any surface underlying substrate 700.

The Switch Backplate Method

Figure 8:
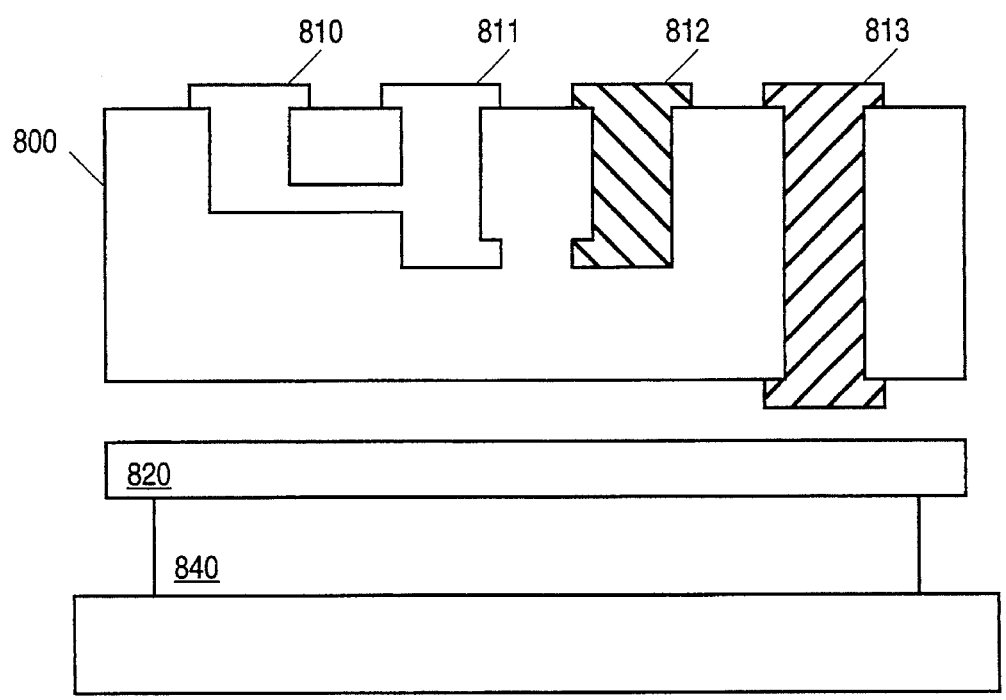
FIG. 8 is a cross sectional diagram illustrating another embodiment of the present invention which incorporates a backplate.

If a substrate does not already contain a backplate, another embodiment of the present invention, the switch backplate method, can be used. Rather than switching the extract grid from a positive to a negative potential, the switch backplate method of the present invention places a backplate between the substrate and the x-y stage, as shown in FIG. 8, and switches the backplate from a negative to a positive potential. In this embodiment the extract grid located above the substrate is held at ground potential while backplate 820 is switched, thus facilitating the charging up of the pad being interrogated.

The switch backplate method works in a similar fashion as the switch grid method. In the switch backplate method, before interrogation of the pad with an electron beam, the extract grid is held at ground potential and the pad, which is in a neutral condition has a potential of approximately 0.0 volts.

In the switch backplate method, backplate 820 starts at ground potential but is changed to a negative potential such that pad 810 is pulled away from equilibrium. It should be noted that it is advantageous to pull the pad far away from equilibrium so that when the pad is interrogated with an e-beam the pad quickly returns to equilibrium. In a currently preferred embodiment the backplate is brought to a negative potential of approximately −80 volts. The change in potential at backplate 820 causes an almost instantaneous change in the potential of pad 810, thus pulling pad 810 away from equilibrium. In a currently preferred embodiment the pad changes almost instantaneously from approximately 0.0 volts to approximately −40 volts.

Once pad 810 is pulled away from equilibrium, the pad is then interrogated with an e-beam in order to "define the voltage" at pad 810. The e-beam interrogates the pad with an energy of a few hundred to a few thousand volts. In a currently preferred embodiment the energy of the e-beam is approximately 600–1000 eV (0.6–1.0 keV). Since the e-beam is interrogating the pad with a few hundred to a few thousand volts the secondary emission yield is greater than one ($\delta$>1). Thus, like in the switch extract grid method, the potential on the pad will change depending upon the potential of the extract grid until the pad and extract grid reach a first equilibrium state.

During interrogation (in the switch backplate method), the extract grid located above the pad is maintained at ground potential. In other words, the extract grid is more positive than pad 810. When the e-beam is interrogating pad 810 the pad emits secondary electrons. Since the extract grid is more positive than pad 810, the extract grid will collect the secondary electrons emitted by pad 810, which causes pad 810 to have a net loss of negative charge. Thus, as the secondary electrons leave, pad 810 becomes positively charged. Eventually pad 810 becomes slightly more positive than the extract grid. At this point the secondary electrons now come back to pad 810 rather than being collected by the extract grid. As with the switch grid method, pad 810 continues to become slightly more negative than the extract grid, then slightly more positive than the extract grid, and then slightly more negative than the extract grid again, etc. When this process occurs over and over the pad and extract grid are said to have reached a first state of equilibrium with respect to one another. In a currently preferred embodiment this first state of equilibrium (or near equilibrium) is reached when the pad reaches a positive potential of approximately +2 volts.

Once this first state of equilibrium is reached (i.e. once the potential on the pad is defined) and while the e-beam is still landing on the pad, the backplate is switched to a positive potential in order to facilitate the "charging up" of the pad. In a currently preferred embodiment backplate 820 is switched to a positive potential of approximately +80 volts. Switching the potential of backplate 820, in this manner, causes the potential on pad 810 to change almost instantaneously and once again pulls pad 810 away from equilibrium. In a currently preferred embodiment the pad changes almost instantaneously from approximately +2 volts to approximately +42 volts. Because the e-beam is still landing at an energy of approximately 0.6–1.0 keV and the extract grid is still at ground, the potential on pad 810 will change until the pad and extract grid are once again in a state of equilibrium.

Since pad 810 is now much more positive than the extract grid, pad 810 will absorb secondary electrons causing pad 810 to have a net gain of negative charge. Thus, as pad 810 absorbs secondary electrons it becomes negatively charged. Eventually pad 810 becomes slightly more negative than the extract grid. At this point since the extract grid is slightly more positive than the pad, the secondary electrons are collected by the extract grid rather than being absorbed by the pad. Now, eventually the extract grid will collect enough secondary electrons that it will cause pad 810 to have a net loss of negative charge. In other words, the pad will be more positive than the extract grid. Because pad 810 is slightly more positive than the extract grid it will again begin to absorb secondary electrons thus, pad 810 will have a net gain of secondary electrons and once again the pad will become slightly more negative than the extract grid. As with the switch grid method, pad 810 continues to become slightly more negative than the extract grid, then slightly more positive than the extract grid, and then slightly more negative than the extract grid again, etc. When this process occurs over and over the pad and extract grid are said to have reached a second state of equilibrium with respect to one another. In a currently preferred embodiment this second state of equilibrium (or near equilibrium) is reached when the pad reaches a positive potential of approximately +2 volts.

In the switch backplate method, the time period from when the pad is pulled away from the first equilibrium state until the pad reaches the second equilibrium state is referred to as "charging-up" of the pad. It will be obvious to one with ordinary skill in the art that the "charging-up" process may also be accomplished by switching backplate 820 from a positive potential to a negative potential, instead of the negative to positive switch described above.

The above described embodiment for testing interconnect networks by switching the potential of the-backplate is advantageous for complex substrates that do not already contain backplates. Additionally, the above described embodiment for testing interconnect networks by switching the potential of the backplate is advantageous for testing multi-level substrates where the thickness of the levels do not shield the substrate from any surface underlying the substrate, and for single level substrates.

One advantage to the switch backplate method is that the e-beam is not affected by the switching potential. In the extract grid method, since the extract grid is located above the pad, the e-beam must penetrate the extract grid in order to reach the pad. Because the extract grid in the extract grid method is maintained at at positive and negative potentials, for example +10 and −10 volts, the potential on the extract grid slightly deflects the e-beam. In the switch backplate method, since backplate 820 is located below the pad and the extract grid is held at ground potential the e-beam is not affected.

The main advantage in switching the potential of the backplate instead of the extract grid is speed. Higher voltages may be used with the switch backplate method thus pulling the pad further from equilibrium. The further from equilibrium a pad is pulled the faster the pad is drawn back to equilibrium. The closer the pad is to equilibrium the slower the change. Thus the switch backplate method is faster.

The electron beam column 580 and secondary electron analyzer 590 used in the present invention, with the exceptions of using different parameters and other small modifications, are similar to those used in the voltage contrast system. One difference in electron beam column 580, used in the present invention, is that e-beam 570 is used with an energy of approximately 600–1000 volts. One difference in secondary electron analyzer 590 is that the extract grid 550 (or backplate, depending upon the embodiment being employed) may be switched between positive and negative potentials. Another difference in secondary electron analyzer 590 is the absence of flood guns. These differences provide the present invention with distinct advantages over the voltage contrast system. The advantages are discussed further below.

One advantage of the present invention is that the switching of the extract grid (or backplate) defines the potential at each pad regardless of the potential that was already at that pad. In other words, it does not matter what the potential of a pad is before interrogation with the e-beam because the present invention defines the potential by bringing the pad to a first equilibrium state and then charging the pad until a second equilibrium state is reached. Since the charge is defined on each pad individually, the errors caused by beam spillover (where the charge on one pad overflows to another pad) are substantially reduced. Thus, once a pad has been tested and verified, there is no need to revisit that pad again. This decreases the motion of the x-y stage.

A second advantage of the present invention is that flood guns are not needed. This also results from the fact that the e-beam defines the potential at each pad, so that it does not matter what the potential at that pad was before interrogation. Therefore, flood guns are not needed to erase the charge disparity between networks on the substrate. Flood guns increase the testing time of the voltage contrast system because testing cannot resume until the electron cloud created by the flood guns dissipates. Since the flood guns are used thousands of times during the testing of a single substrate the testing time is substantially increased by their use. It should be noted, however, that although flood guns are not necessary to the present invention there may be some instances when the use of flood guns in combination with the present invention is advantageous. As an example, using flood guns to flood the substrate before testing to remove unwanted charges will speed up the testing of the substrate using the present invention.

A third advantage is that the present invention does not suffer the deleterious effects of improper registration. The e-beam of the present invention interrogates the pad with an energy of approximately 600–1000 eV which does not cause harmful effects if the e-beam lands on the insulator. The present invention, therefore, does not require costly additions to the testing process, such as, the addition of fiducial marks to a substrate, the use of dual beam substrate testers, or deceleration of the beam just before landing on the pad.

A fourth advantage is that the present invention can be used with substrates which have much lower resistance than was possible with previous systems. With other electron beam testing systems, the resistance of a network to other networks and to the substrate must be high enough to hold charge on its self capacitance for the duration of an approximately one second test sequence between the erase operations using the flood guns. As one example, for a 10 pF network RC must be approximately one second and R must be approximately $10^{11}$ ohms. Up until now, substrate materials, such as, polymide, alumina, silicon oxide, silicon nitride, and FR4 epoxy glass dielectrics are suitable for electron beam testing with proper cleaning and handling. Now, with the present invention, each pad is self contained (i.e. the test takes place completely while addressing a specific pad and no charge retention is required), therefore, substrates comprising dielectrics with much lower resistances can be tested than was possible before. This opens up the application of the electron beam substrate testing procedure to a much wider variety of multichip modules than was previously possible.

An additional advantage of the present invention over the voltage contrast system is that the present invention automatically accounts for contamination on the substrate. In the voltage contrast system, if the pad being interrogated is contaminated an erroneous signal might be detected since the contamination could be blocking secondary electron emissions. The present invention defines the potential on each pad and then interrogates by measuring the time it takes the pad to change from a first equilibrium state to a second equilibrium state, therefore, the present invention is unaffected by contamination on the pad.

Thus, a switch potential electron beam substrate tester has been described. Although specific embodiments, including specific equipment, process parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method to test an interconnect network of a multichip module for opens and shorts comprising the steps of:

maintaining an extract grid at a first grid potential;

defining a potential on a pad such that said pad and said extract grid reach a first state;

switching said extract grid to a second grid potential;

maintaining said extract grid at said second grid potential until said pad and said extract grid reach a second state; and measuring a test time, in order to determine the capacitance of said interconnect network being tested.

2. The method as described in claim 1 wherein said potential on said pad is defined using an electron beam.

3. The method as described in claim 2 wherein said electron beam has an energy of approximately 600–1000 eV.

4. The method as described in claim 1 wherein said test time is the time it takes to change from said first state to said second state.

5. The method as described in claim 1 further comprising the step of comparing said test time to a predetermined reference time, wherein said predetermined reference time is the time it takes a properly connected interconnect network to change from said first state to said second state.

6. A method to test an interconnect network of a multichip module for opens and shorts comprising:

maintaining an extract grid at a first grid potential;

defining a first potential on a pad;

switching said extract grid to a second grid potential;

maintaining said extract grid at said second grid potential until said pad reaches a second potential; and measuring the time it takes said pad to change from said first potential to said second potential, in order to determine the capacitance of said interconnect network being tested.

7. The method as described in claim 6 wherein said first potential is defined on said pad using an electron beam.

8. The method as described in claim 7 wherein said electron beam has an energy of approximately 600–1000 eV.

9. The method as described in claim 6 wherein said first grid potential and said first potential are positive.

10. The method as described in claim 9 wherein said first grid potential and said first potential are approximately +10 and +12 volts, respectively.

11. The method as described in claim 6 wherein said second grid potential and said second potential are negative.

12. The method as described in claim 11 wherein said second grid potential and said second potential are approximately −10 and −8 volts, respectively.

13. The method as described in claim 6 further comprising the step of comparing said test time to a predetermined reference time, wherein said predetermined reference time is the time it takes a pad on a properly connected interconnect network to change from said first potential to said second potential.

14. A system for testing an interconnect network of a multichip module for opens and shorts comprising:

an extract grid, wherein said extract grid is coupled to a voltage source, said extract grid being capable of being switched between a first grid potential and a second grid potential in order to determine the capacitance of said interconnect network being tested;

an electron emissions detector; and an electron beam column.

15. The system as described in claim 14 wherein said extract grid is located above said multichip module.

16. The system as described in claim 15 wherein said first grid potential is positive and said second grid potential is negative.

17. The system as described in claim 14 wherein said electron emissions detector is used to detect when a pad of said multichip module and said extract grid have reached approximately the same potential with respect to one another.

18. The system as described in claim 14 wherein said electron emissions detector comprises a photomultiplier tube.

19. The system as described in claim 14 wherein said electron beam column is used to define a potential on a pad of said multichip module.

20. The system as described in claim 14 wherein said electron beam column produces an electron beam with an energy of approximately 600 –1000 eV.

21. The system as described in claim 14 further comprising:

a backplate, wherein said backplate is held at ground potential.

* * * * *

UNITED STATES PATENT AND TRADEMARK OFFICE
CERTIFICATE OF CORRECTION

PATENT NO.    : 5,602,489
DATED         : February 11, 1997
INVENTOR(S)   : El-Kareh et al.

It is certified that error appears in the above-identified patent and that said Letters Patent is hereby corrected as shown below:

In column 2 at line 50 insert --At first crossover 100 the value of $\partial$ increased to equal 1. The value of $\partial$ continues to increase until it reaches $\partial$max 110.-- following "increases." and prior to "However,"

In column 2 at line 54 insert --The value of $\partial$ decreases to 1 at the second crossover 120 and eventually decreases to a value less than 1.-- following "decrease."

In column 3 at line 12 insert --210-- following "charged" and prior to "the"

Figure 1:
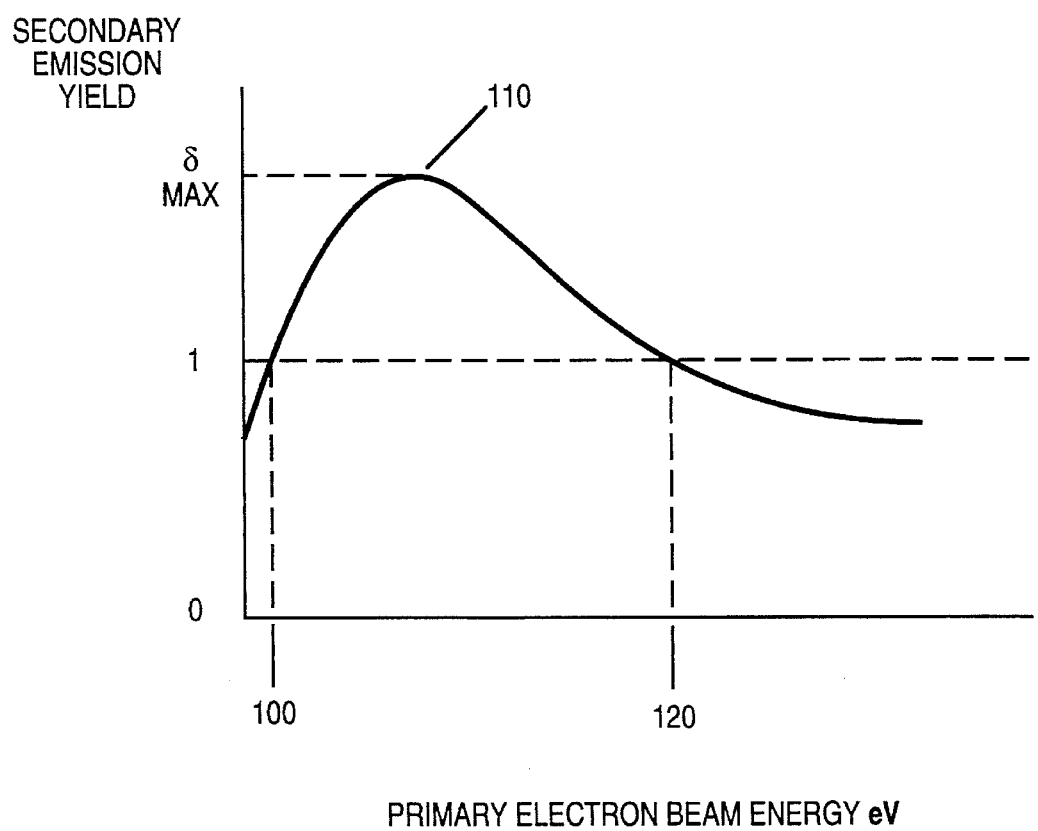
FIG. 1 illustrates the secondary emission yield (δ) of an electron beam substrate tester.
Figure 2:
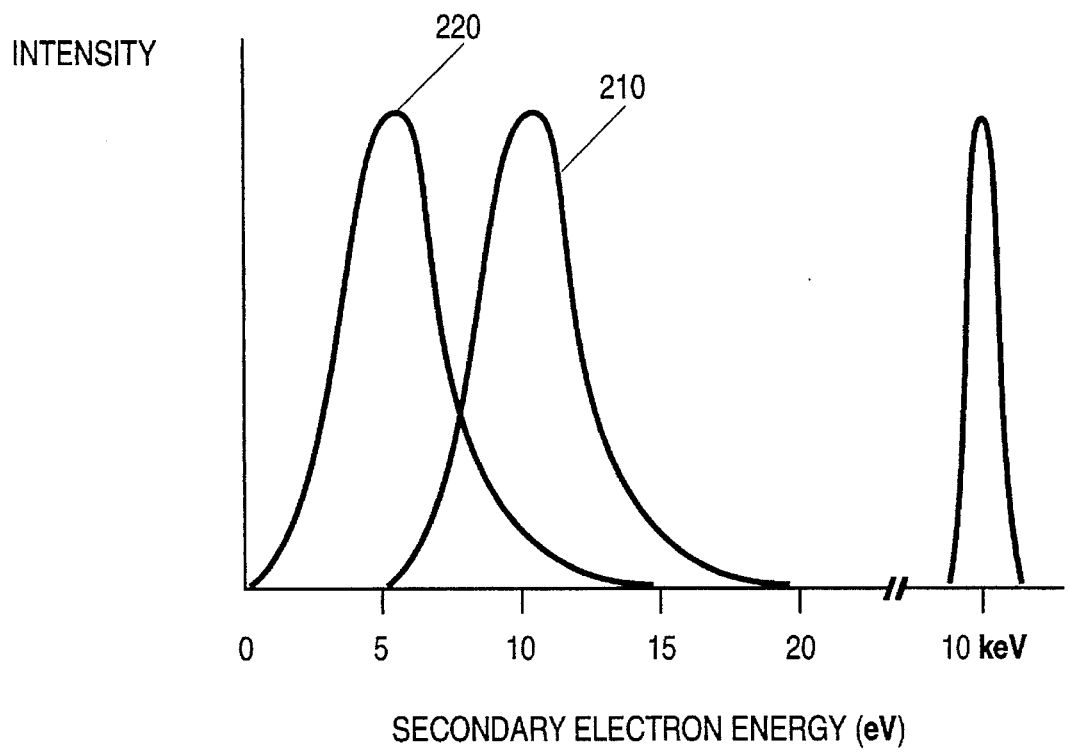
FIG. 2 illustrates the secondary electron spectrum of an uncharged and a charged pad.
Figure 3A:
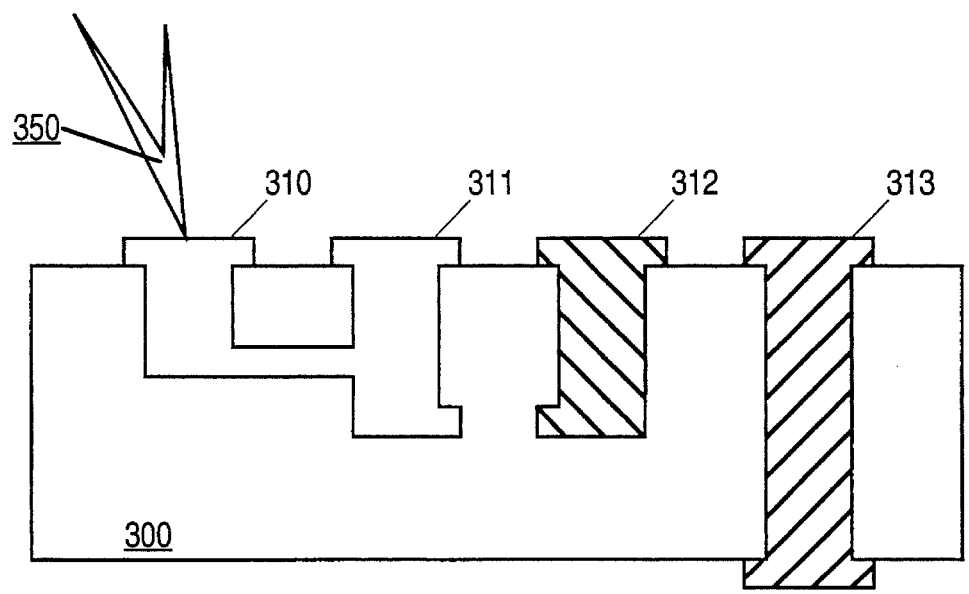
FIGS. 3a–3c illustrate a cross sectional view of a substrate during interrogation with the voltage contrast system.

In column 3 at line 26 insert   , see FIG 3a.-- following "310" and prior to "."

Figure 3B:
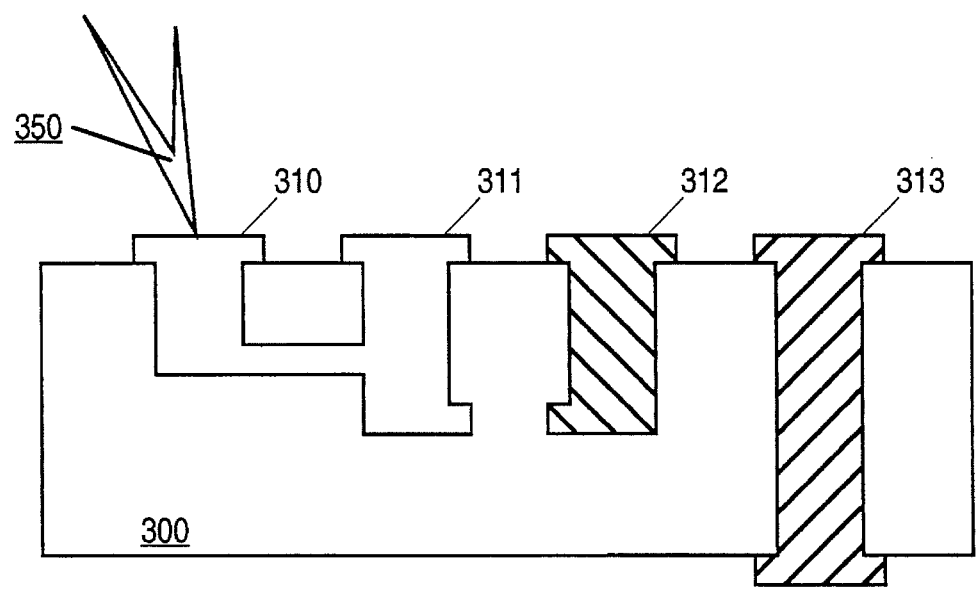

In column 3 at line 38 insert   , see FIG 3b.--following "350" and prior to "."

Figure 3C:
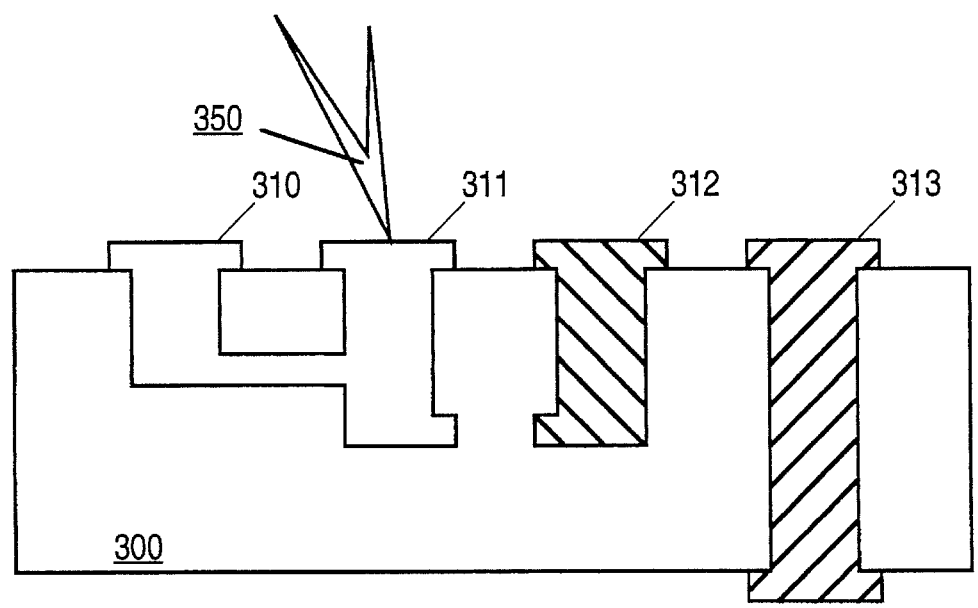
Figure 4:
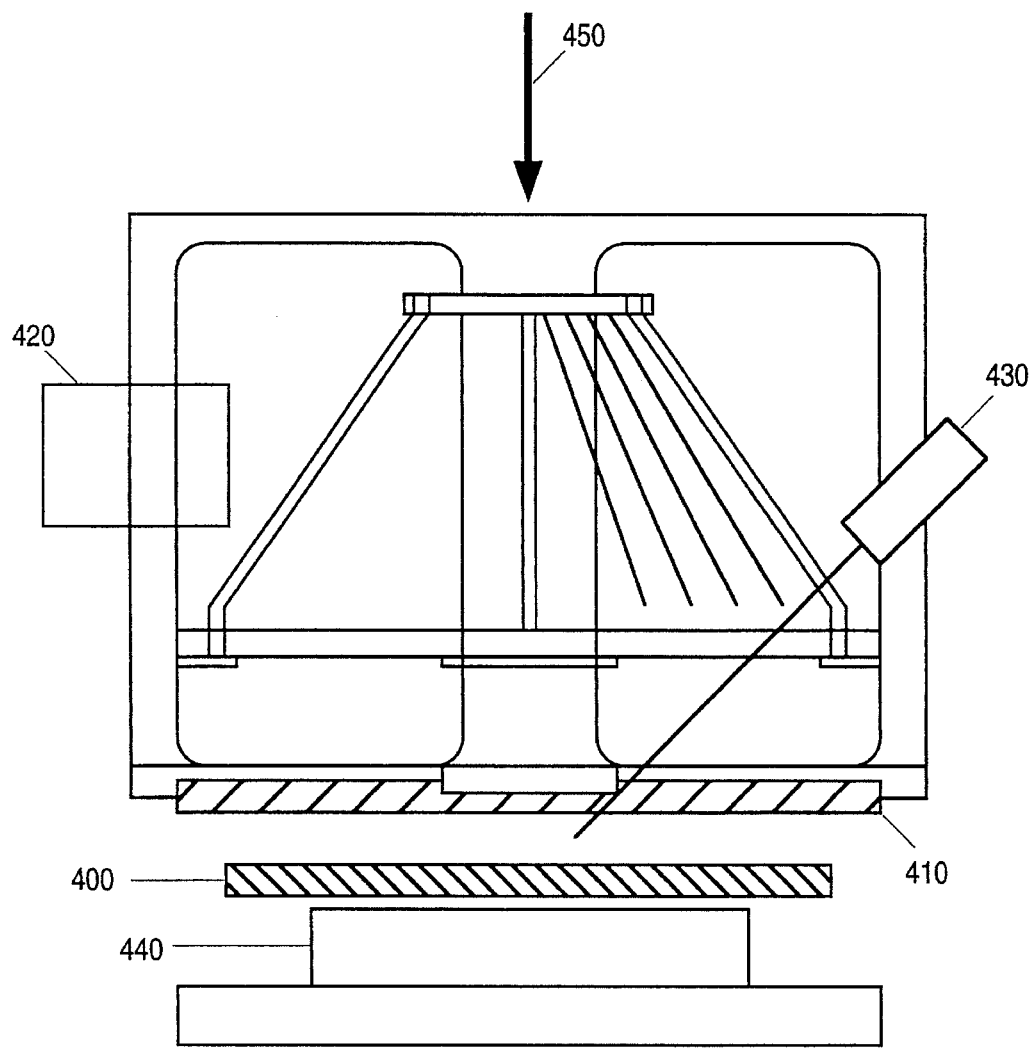
FIG. 4 illustrates a cross sectional view of a secondary electron analyzer used in a voltage contrast system.

In column 3 at line 42 insert , see FIG 3c.--following "voltage" and prior to "."

In column 8 at line 40 delete "in" and insert --In--

UNITED STATES PATENT AND TRADEMARK OFFICE
CERTIFICATE OF CORRECTION

PATENT NO. : 5,602,489

DATED : February 11, 1997

INVENTOR(S) : El-Kareh et al.

It is certified that error appears in the above-identified patent and that said Letters Patent is hereby corrected as shown below:

In column 9 at line 1 insert --Simulation lines 530 help to graphically illustrate the charging time of pad 511 and pad 521.-- following "520a." and prior to "As"

In column 9 at line 49 delete lines 49-53 and insert --Figure 5e illustrates the differences in charging time of pad 511 on small network 510 when the network is open 510b, defect-free 510a, or shorted 510c. The charging time for pad 511 on defect-free 510a small network 510 is approximately 1200 $\mu$sec. An open network 510b has a decreased capacitance, therefore, a pad on an open network 510b has a lower charging time than a pad on a defect-free network. The charging time for open 510b small network 510 is approximately 650 $\mu$sec. A shorted network 510c has an increased capacitance, therefore, a--

In column 9 at line 58 insert --510c-- following "network" and prior to "has"

In column 9 at line 59 insert --510c-- following "Shorted" and prior to "small"

UNITED STATES PATENT AND TRADEMARK OFFICE
CERTIFICATE OF CORRECTION

PATENT NO.   : 5,602,489
DATED        : February 11, 1997
INVENTOR(S)  : El-Kareh et al.

It is certified that error appears in the above-identified patent and that said Letters Patent is hereby corrected as shown below:

In column 9 at line 63 delete the paragraph beginning with "FIG. 5f" and ending with "8900 μsec." and insert --Figure 5f (similar to Figure 5e) illustrates the differences in charging time of pad 521 on medium network 520 when the network is open 520b, defect-free 520a, or shorted 520c. The charging time for pad 521 on defect-free 520a medium network 520 is approximately 4500 μsec. An open network 520b has a decreased capacitance, therefore, a pad on an open network 520b has a lower charging time than a pad on a defect-free network 520a. The charging time for open 520b medium network 520 is approximately 2100 μsec. A shorted network 520c has an increased capacitance, therefore, a pad on a shorted network 520c has a higher charging time than a pad on a defect free network 520a. Shorted 520c medium network 520 has a longer charging time and by extrapolating the graph in Figure 5f for shorted 520c medium network 520 the charging time can be shown to be approximately 8900 μsec.--

In column 10 at line 19 insert --630-- following "networks" and prior to "on"

Signed and Sealed this

Twenty-fourth Day of June, 1997

Attest:

Attesting Officer

BRUCE LEHMAN
Commissioner of Patents and Trademarks